(12) United States Patent
Allen et al.

(10) Patent No.: US 6,307,142 B1
(45) Date of Patent: Oct. 23, 2001

(54) COMBUSTION HEAT POWERED PORTABLE ELECTRONIC DEVICE

(75) Inventors: Daniel T. Allen, San Diego; John C. Bass; Norbert B. Elsner, both of La Jolla, all of CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 09/548,532

(22) Filed: Apr. 13, 2000

(51) Int. Cl.[7] ..................................................... H01L 35/30
(52) U.S. Cl. ............................................. 136/205; 136/242
(58) Field of Search ..................................... 136/204, 205, 136/242

(56) References Cited

FOREIGN PATENT DOCUMENTS 60-59982 * 4/1985 (JP) .
4-85973 * 3/1992 (JP) .

* cited by examiner

Primary Examiner—Kathryn Gorgos
Assistant Examiner—Thomas H Parsons
(74) Attorney, Agent, or Firm—John R. Ross; John R. Ross, III

(57) ABSTRACT

A combustion heat powered portable electronic device. At least one thermoelectric module is sandwiched between a hot block heated by a combustion heat source and a cold-side heat sink and provides electric power to a portable electronic device from the temperature difference. An electric circuit provides power for purposes of operating the portable electronic device either directly or indirectly by charging a rechargeable battery which in turn provides power to the electronic device. In a preferred embodiment the combustion heat source is a catalytic combustion unit. The hot block and/or cold side heat sink can be integrated into a single unit with the thermoelectric module. In a preferred embodiment the cold side heat sink is cooled by fins cooled by air driven by a forced air fan powered by the thermoelectric module.

21 Claims, 8 Drawing Sheets

COMBUSTION HEAT POWERED PORTABLE ELECTRONIC DEVICE

BACKGROUND OF THE INVENTION

1. Field of the Invention

This invention relates to portable electronic devices and power sources for such devices.

2. Description of the Related Art

A very large number of important portable electronic devices are becoming available to people throughout the world. Better integrated circuits have greatly reduced the electric energy required to operate these devices and rechargeable batteries are available to power these devices which may be recharged from utility electric sources; however, sometimes such recharging is inconvenient.

Thermoelectric generators are well known. These devices utilize the physics principal known as the Seebeck effect discovered in 1821. If two wires of different materials such as copper and iron are joined at their ends forming two junctions, and one junction is held at a higher temperature than the other junction, a voltage difference will arise between the two junctions. Most thermoelectric generating devices currently in use today utilize semiconductor materials (such as bismuth telluride) which are good conductors of electricity but poor conductors of heat. These semiconductors are typically heavily doped to create an excess of electrons (n-type) or a deficiency of electrons (p-type). An n-type semiconductor will develop a negative charge on the cold side and a p-type semiconductor will develop a positive charge on the cold side. Since each element of a semiconductor thermoelectric device will produce only a few millivolts it is generally useful to arrange the elements in series so as to produce higher voltages. Several techniques have been developed for arranging the semiconductor elements in series in thermoelectric devices. One such method is to use a so-called eggcrate design where a small eggcrate-shaped structure made of insulating material separates the thermoelectric elements and permits the elements to be connected in series in an automated fabrication process to reduce the cost of fabricating these modules and improve reliability. Modules of this design are described in U.S. Pat. No. 5,892,656 that is incorporated herein by reference. The module's (HZ-2) dimensions are 1.15 inches×1.15 inches× 0.20 inch. It will deliver, with a 360 degree F. temperature difference, an open circuit voltage of 6.5 volts and has a design operating range of 2.5 to 4.5 volts with an efficiency of 4½%. The HZ-2 module is available from Hi-Z Technology, Inc. in San Diego, Calif.

Small portable combustion sources for heat and light have been available for many years. Examples are butane cigarette lighters and portable backpacking stoves where combustion is in the form of a flame. Small catalytic converters are available which will produce a very high temperature without a flame. One device using this technique is a soldering iron.

For many years thermoelectric devices have been used to provide electric power in space vehicles using as a heat source a very small radioactive source and as a cold heat sink the natural coldness of outer space. Use of radioactive sources in populated environments on earth to provide thermoelectric power for portable electronic devices could create problems.

What is needed are portable electronic devices powered with small combustion heat sources.

SUMMARY OF THE INVENTION

The present invention provides a combustion heat powered portable electronic device. At least one thermoelectric module is sandwiched between a hot block heated by a combustion heat source and a cold-side heat sink and provides electric power to a portable electronic device from the temperature difference. An electric circuit provides power for purposes of operating the portable electronic device either directly or indirectly by charging a rechargeable battery which in turn provides power to the electronic device. In a preferred embodiment the combustion heat source is a catalytic combustion unit. The hot block and/or cold side heat sink can be integrated into a single unit with the thermoelectric module. In a preferred embodiment the cold side heat sink is cooled by fins cooled by air driven by a forced air fan powered by the thermoelectric module.

DETAILED DESCRIPTION OF PREFERRED EMBODIMENTS

First Preferred Embodiment

Figure 1:
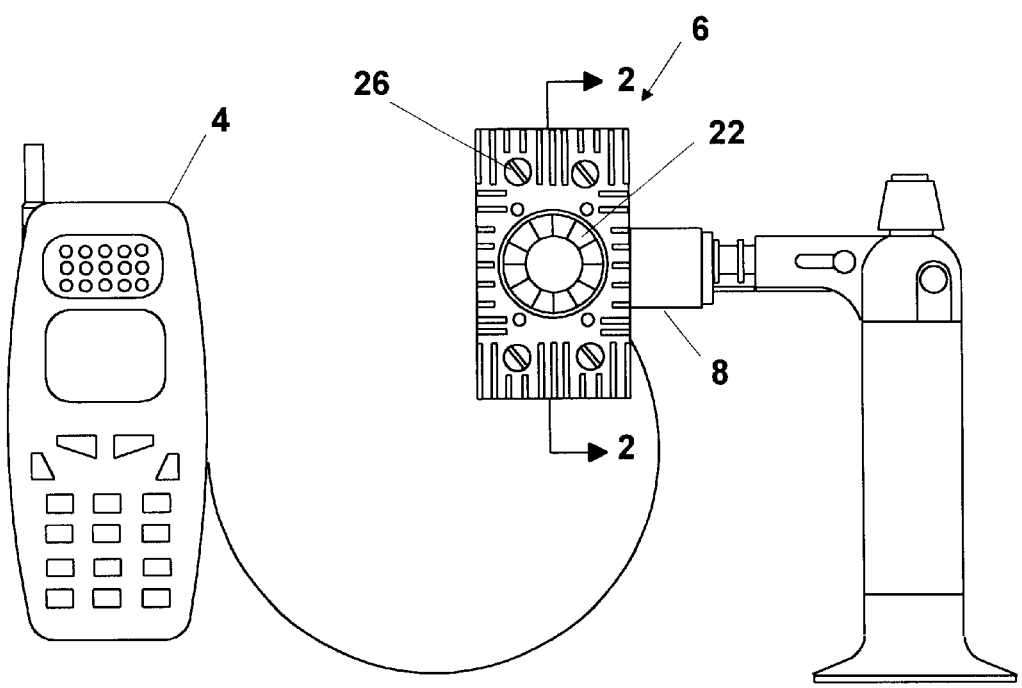
FIG. 1 shows a preferred embodiment of the present invention.
Figure 3:
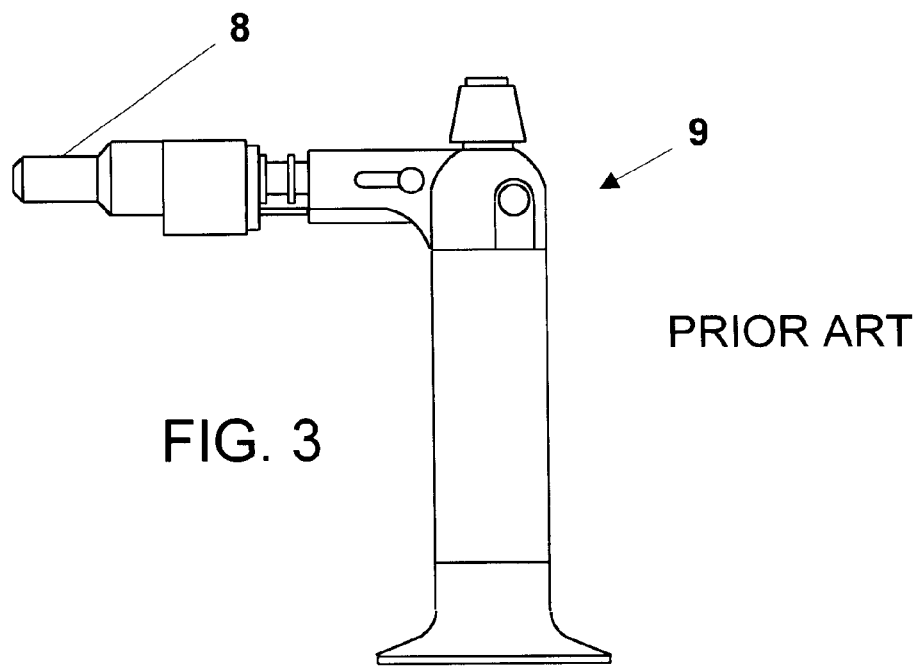
FIG. 3 shows a prior art catalytic solder device.

A prototype of a preferred embodiment of the present invention can be described by reference to the figures. FIG. 1 shows a portable telephone 4 such as is available from a large number of suppliers such as Motorola and Erickson. A typical hand-held portable telephone currently in use operates at a voltage potential of up to approximately 6 volts and consumes about 3 Watts while sending or receiving about 1 Watt while turned on and waiting. This telephone is powered by a thermoelectric generator 6, which in turn is powered by a temperature differential produced by a catalytic converter 8. The catalytic converter is a part of a prior-art butane fueled soldering iron 9. The prior art soldering iron 9 except for its soldering tip is shown in assembly form in FIG. 3. This is an off-the-shelf soldering iron sold under the name "MicroTorch" (Bernz-O-Matic, Model ST1000TS). Operation of the torch consumes fuel at the rate of about 18 gm/hr and produces about 250 Watts with efficiency in excess of 90 percent.

Figure 2:
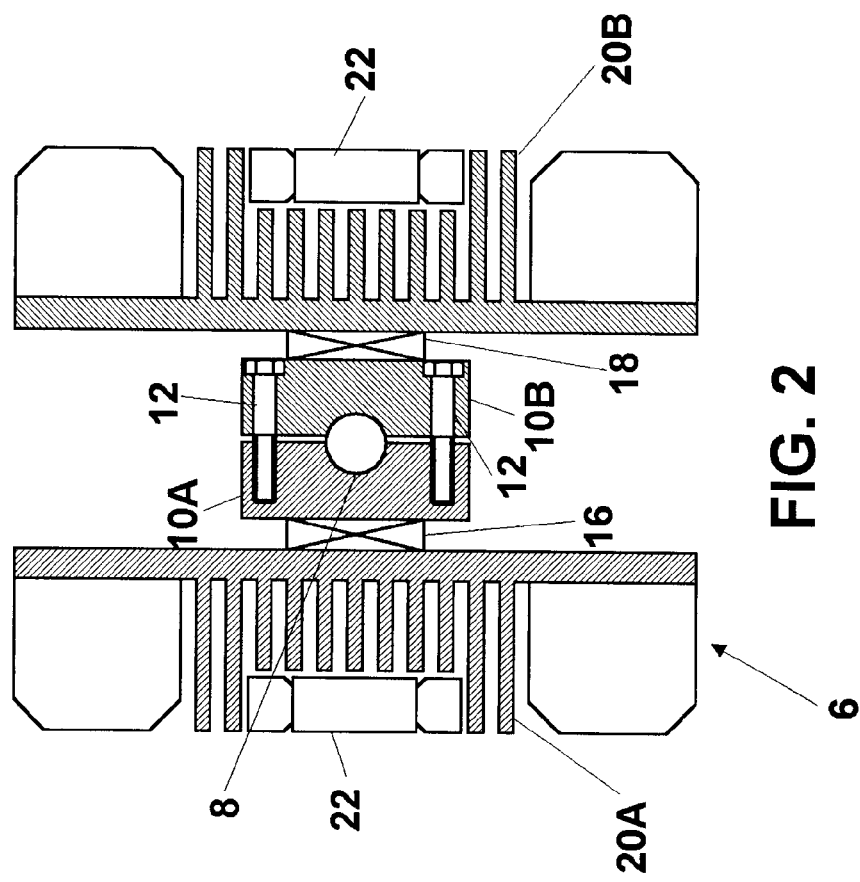
FIG. 2 shows a portion of the FIG. 1 embodiment.
Figure 4:
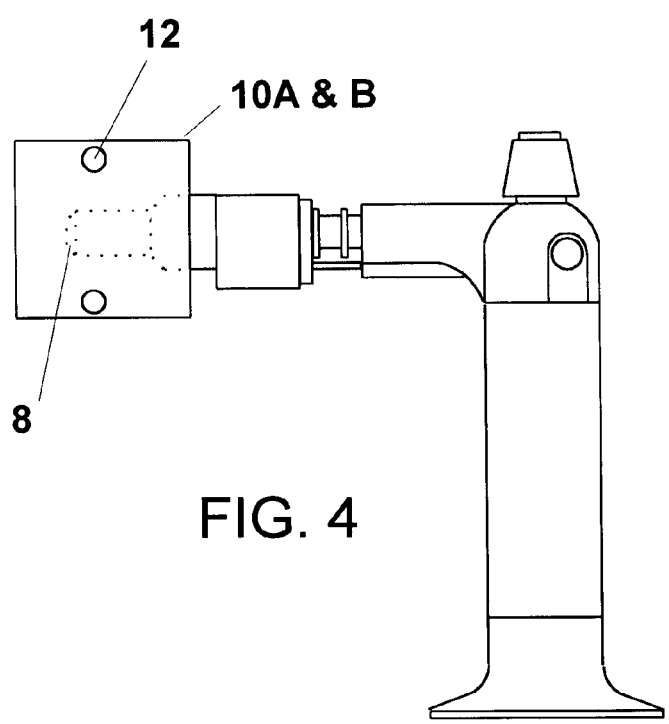
FIG. 4 shows the FIG. 3 device with a hot block installed.
Figure 5B:
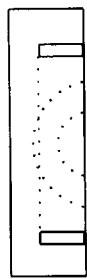
FIGS. 5A, B and C are three views of the hot block shown in FIG. 4.
Figure 5A:
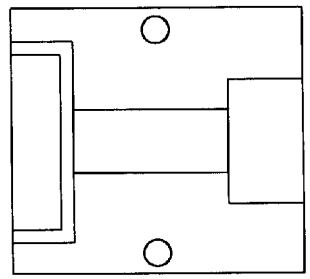
Figure 5C:
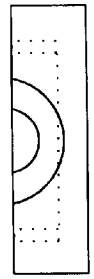
Figure 6:
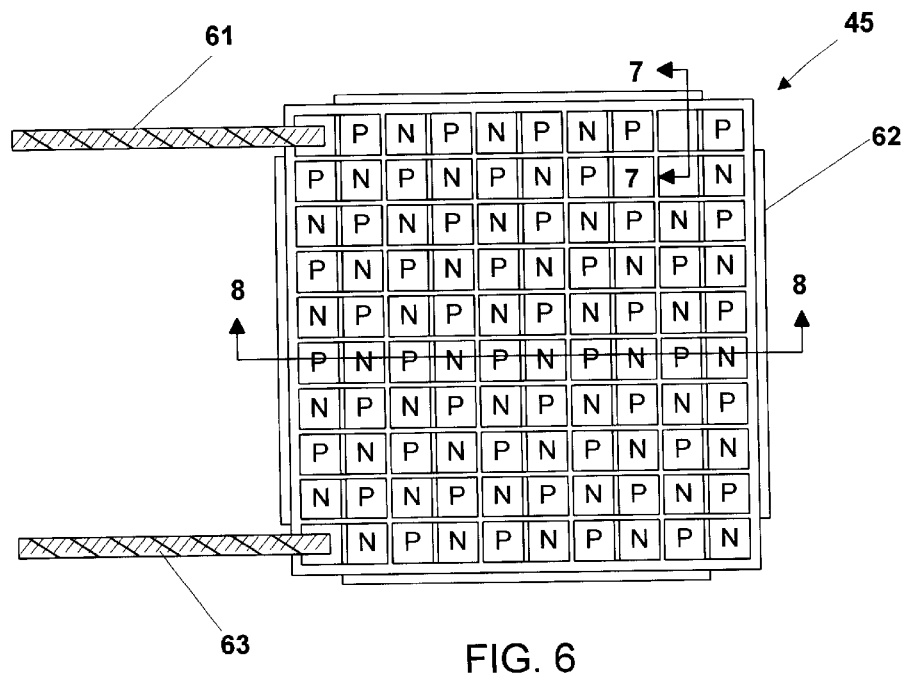
FIG. 6 shows the principal elements of a thermoelectric module using an injection-molded eggcrate.
Figure 8:
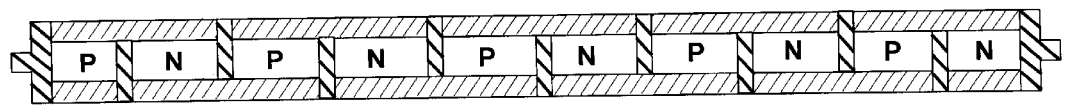
FIGS. 7 and 8 are partial views of the FIG. 6 module.
Figure 7:
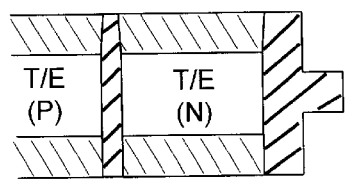

Applicant machined a hot block 10A and 10B so it would fit very tightly on the converter attachment 8 with two clamps 12 as shown in FIG. 4 and FIG. 2. One half of the machined block is shown in FIGS. 5A, B and C. Each half of the aluminum block provides a hot side heat sink for a thermoelectric module. Preferred modules are Hi-Z thermoelectric modules 16 and 18 (HZ-2) each rated at 2.5 Watts at 3.3 Volts.

On the outside (cold side) surfaces of each of the modules Applicants mounted a Pentium II heat sink (CPU-Cool K1 made by PC Power & Cooling, Inc. of Carlsbad, Calif.). These coolers comprise a finned aluminum structure on one side and a smooth, flat surface on the other. Existing mounting holes were utilized with longer screws to sandwich the entire assembly (the converted soldering heat source, hot block 10A and 10B, two thermoelectric modules 16 and 18, and two cold side heat sinks 20A and 20B) together. The assembly is held in compression with four bolts 26 (FIG. 1) with compression nuts and Belville washers not shown and loaded to about 200 pounds.

On both sides of the thermoelectric modules a heat transfer paste (such as WAKEFIELD thermal compound) is used and a 0.01" thick ceramic wafer (such as KYOCERA industrial ceramic aluminum oxide) is applied to provide electrical insulation. Other faces of the hot block are covered with thermal insulation except for where torch attachment 8 entered and where the hot gas exits.

Each of the heat sinks come with integral mini-fans 22 (FIG. 2) to enhance heat removal. These fans are of a standard configuration 40 mm square outside dimensions. These fans run at 5 Volts and use about 0.7 Watts for a total of 1.4 Watts.

Figure 9:
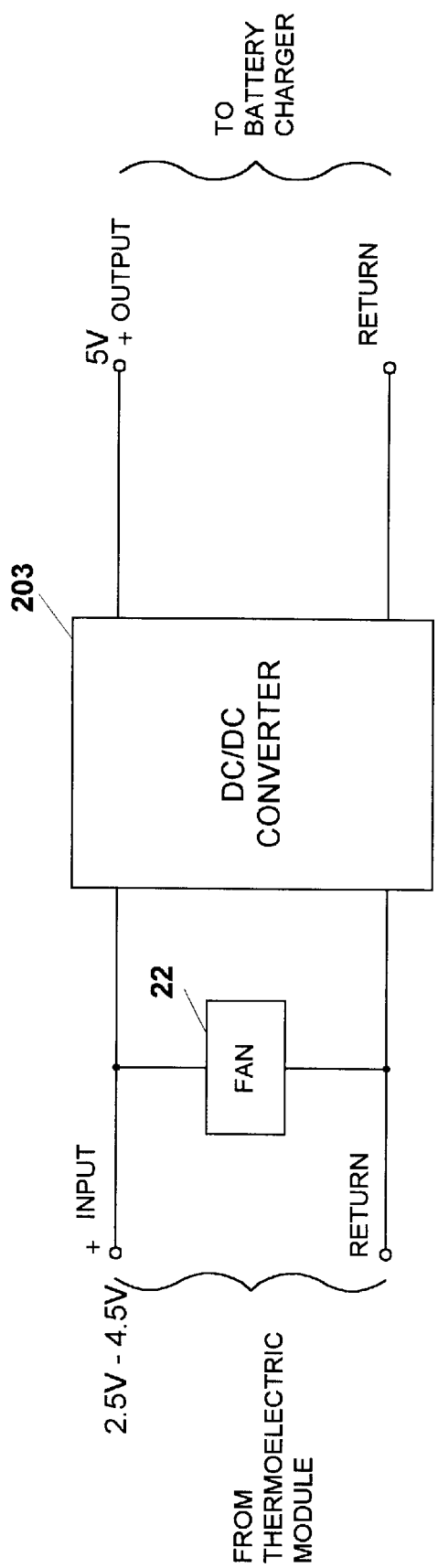
FIG. 9 shows a simple electric circuit showing how power is delivered from the thermoelectric module to a fan and battery charger contacts.

FIG. 9 shows a simple electric circuit for use with the present invention. HZ-2 Thermoelectric Module provides a reference voltage of approximately 2.5–4.5 volts and is used to power mini-fan 22. DC/DC converter 203 converts the input voltage so that there is a steady output voltage of 5 volts at the positive output. In a preferred embodiment, the DC/DC converter is available, off-the-shelf from Maxim as Model No. 608EV.

Thermoelectric Module

Thermoelectric modules 16 and 18 are preferably model HZ-2 which are available from Hi-Z Technology, Inc. with offices in San Diego, Calif., although other thermoelectric modules could be utilized.

Second Preferred Embodiment

Figure 10:
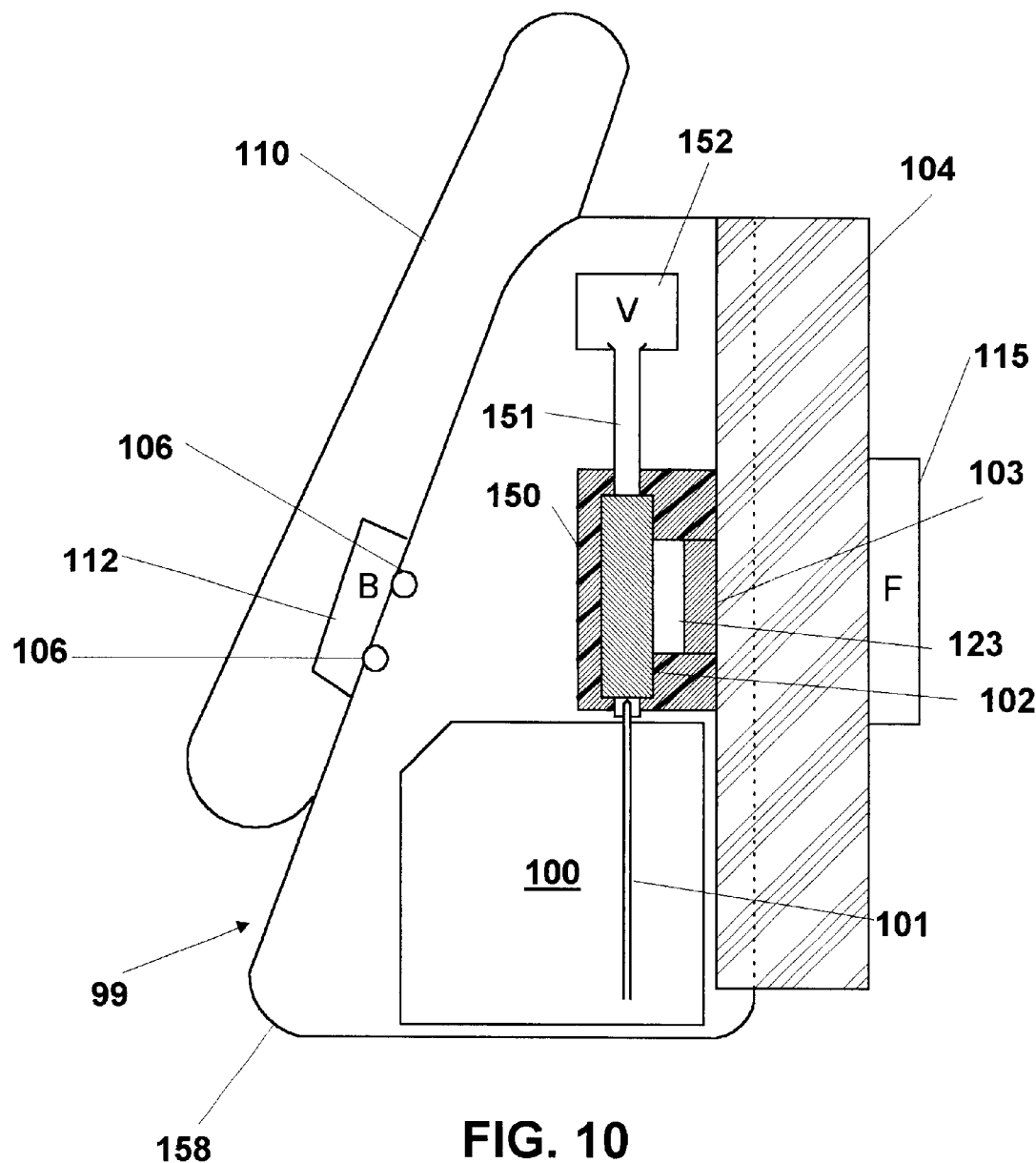
FIG. 10 shows another preferred embodiment of the present invention.

A second preferred embodiment of the present invention is a combustion heat powered cell phone unit shown in FIG. 10. The unit includes portable battery charger 99, fuel tank 100, thermoelectric module 103 and catalytic heater 102 are mounted within casing 158 and cold side fin unit 104 is mounted to the side of casing 158.

A gaseous hydrocarbon fuel (such as butane or propane) is stored under pressure in fuel tank 100. The fuel exits pressurized fuel tank 100 via tube 101 and enters catalytic heater 102 in which heat is generated. Exhaust from catalytic heater 102 flows out through exhaust tube 151 and through vent 152.

Thermoelectric module 103 is sandwiched between hot block 123 and cold side fin unit 104. Preferrably, thermoelectric module is model HZ-2 available from Hi-Z Technology, Inc. Thermal insulation 150 surrounds catalytic heater 102 except where it contacts hot block 123 and at the fuel entrance port and the exhaust port. Fin unit 104 has fins that are cooled by air driven by a forced air fan 115. Fin unit 104 functions to remove heat from thermoelectric module 103. Heat from battery charger 99 is equivalent to a small light bulb and is suitable for keeping a tent warm on a cool night.

Catalytic heater 102 heats hot block 123. Thermoelectric module 103 uses the temperature difference between hot block 123 and cool side fin unit 104 to generate about 2 watts. Thermoelectric module 103 is electrically connected through an electric circuit (not shown) to battery contacts 106 and forced air fan 115.

FIG. 10 shows cell phone 110 mounted to portable battery charger 99. Rechargeable battery 112 is in electrical contact with battery contacts 106. Battery charger 99 generating two watts of electrical power can fully charge a discharged battery in three hours, one cup of fuel would be sufficient for recharging the battery about ten times. This means that under average usage where one fully charged battery lasts one day, a cup of fuel is good for ten days. A five gallon can would last for more than two years.

Third Preferred Embodiment

Figure 11:
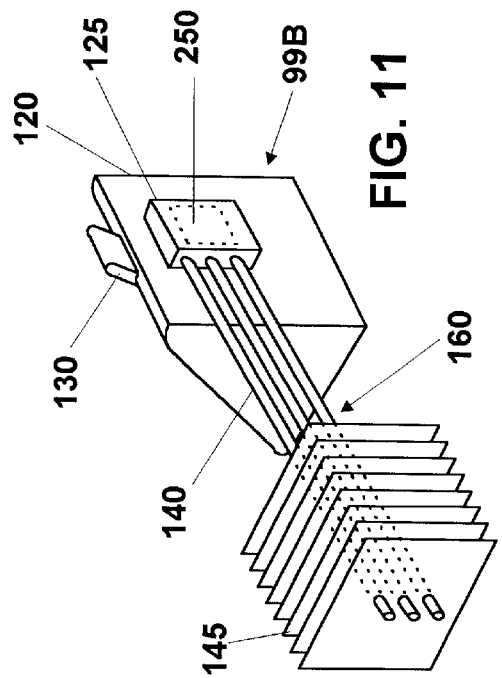
FIG. 11 shows another preferred embodiment of the present invention.

FIG. 11 shows a third preferred embodiment similar to the second preferred embodiment. Cell phone 130 is shown mounted to portable battery charger 99B. Fin unit 104 (FIG. 10) has been replaced by heat pipe 160, which serves as the third embodiment's cold side heat sink. Heat receiving plate 125 is mounted to the back of casing 120 and is in thermal contact with thermoelectric module 250. Heated vapor flows through heat pipes 140 towards fins 145 where it condenses, releasing heat through fins 145. Wicks inside pipes 140 return cooled working fluid back towards heat receiving plate 125, where the cycle is repeated. In a preferred embodiment, heat pipe 160 is made by Thermacore International with offices in Lancaster, Pa. The Thermacore heat pipe dissipates 90 W with a temperature rise above ambient of 30 degrees C. The fins surface area is 3760 cm$^2$.

An advantage of the third preferred embodiment is that because no fan is required energy is saved. Also, because there is no fan the third preferred embodiment is quieter.

Integral Unit

Figure 12:
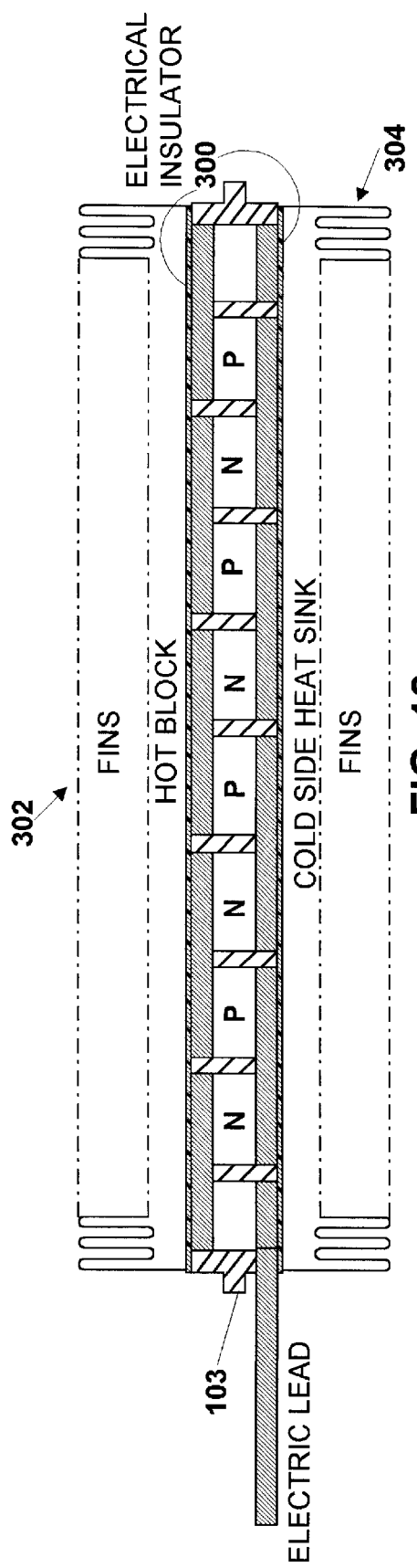
FIG. 12 shows another preferred embodiment of the present invention.

The hot block and cold side heat sink can be integrated with the thermoelectric module into one integrated unit as shown in FIG. 12. In this case both hot and cold sides of thermoelectric module 103 are covered by an electrical insulating layer 300 of alumina by a process of thermal spray. On top of this layer is a 1 to 2 mil layer of molybdenum copper which is also added by thermal spray. Hot side fin unit 302 and cold side fin unit 304 both comprised of molybdenum copper may be then brazed to the thin copper layer to form the integral unit shown in FIG. 12.

While the above description has dealt with a single preferred embodiment of the present invention, the reader should understand that many modifications could be made and still be within the scope of the invention. For example, four or more modules could be mounted on the hot block by providing appropriate flat spaces. Many other types of catalytic heat units are available other than the one shown. Preferably, a commercial unit would be specially designed and offered in an attractive case. When made a part of a portable telephone unit the telephone and the generator could be provided in the same package with a port for adding the fuel. Although the above disclosed embodiments showed catalytic combustion unit as a heat source, those of ordinary skill in the art will recognize that it is also possible to heat the thermoelectric module with an open flame. Those of ordinary skill in the art will recognize that for the second preferred embodiment it is possible to substitute the gaseous hydrocarbon fuel with a liquefied hydrocarbon fuel such as kerosene, alcohol, gasoline, diesel oil or jet fuel. If a liquefied hydrocarbon fuel is used, rather than being stored under pressure, the fuel would flow into the catalytic heat by another suitable means (i.e., such as by utilizing a wick or a pump). Also, although it was stated that mini-fan 22 runs at 5 Volts, other fans that run at different voltages could be used (for example, 3 Volts, 6 Volts, or 12 Volts). Although in the first preferred embodiment, a specific DC/DC converter was described, those of ordinary skill in the art will recognize that there are many other off-the-shelf DC/DC converters that could be used as well as a variety of DC/DC circuits. Moreover, those of ordinary skill in the art will recognize that it is possible to charge a variety of other electronic appliances besides a portable cell phone with the present invention. Some other applications include: radios, toys, portable television sets, fans, video cameras, laptop computers, water pumps, valves, camera flashes, lights, heaters, and medical test equipment. Therefore, the attached claims and their legal equivalents should determine the scope of the invention.

What is claimed is:

1. A portable combustion heat powered electronic device, comprising:
   A) a hot block,
   B) a combustion heat source for heating said hot block,
   C) a cold side heat sink,
   D) a cooling means for cooling said cold side heat sink,
   E) at least one thermoelectric module, disposed between and in thermal contact with said hot block and said cold side heat sink, for generating electric power from a temperature difference between said hot block and said cold side heat sink,
   F) a portable electronic device, and
   G) an electric circuit for providing power from said at least one thermoelectric module to operate said portable electronic device.

2. A portable combustion heat powered electronic device as in claim 1, wherein said combustion heat source is an open flame.

3. A portable combustion heat powered electronic device as in claim 1, wherein said heat source is a catalytic combustion heat source.

4. A portable combustion heat powered electronic device as in claim 3 wherein said catalytic combustion heat source is fueled with butane.

5. A portable combustion heat powered electronic device as in claim 1 wherein said at least one thermoelectric module is two thermoelectric modules.

6. A portable combustion heat powered electronic device as in claim 5 wherein said hot block is comprised of aluminum.

7. A portable combustion heat powered electronic device as in claim 1, wherein said cooling means is at least one fin unit.

8. A portable combustion heat powered electronic device as in claim 7, further comprising at least one fan positioned to circulate air through one of said at least one fin unit.

9. A portable combustion heat powered electronic device as in claim 8 wherein said electric circuit further provides power for operating said at least one fan.

10. A portable combustion heat powered electronic device as in claim 1, wherein said cold side heat sink is a heat pipe unit.

11. A portable combustion heat powered electronic device as in claim 1 and further comprising a rechargeable battery connected in said electric circuit for storing power to operate said electronic device.

12. A portable combustion heat powered electronic device as in claim 1 wherein said electronic device is a portable telephone.

13. A portable combustion heat powered electronic device as in claim 1 wherein said at least one thermoelectric module is held in compression between said heat source and said cold side heat sink with Bellville washers.

14. A portable combustion heat powered electronic device as in claim 1, wherein said hot block and said thermoelectric module are an integral unit.

15. A portable combustion heat powered electronic device as in claim 1, wherein said cold side heat sink and said thermoelectric module are an integral unit.

16. A portable combustion heat powered electronic device as in claim 1, wherein said hot block, said cold side heat sink and said thermoelectric module are an integral unit.

17. A portable combustion heat powered electronic device, comprising:
   A) a combustion heat source,
   B) a hot block positioned to conduct heat away from said heat source,
   C) at least two heat sinks,
   D) at least two thermoelectric modules, each module being mounted in thermal contact with a hot block and one of said at least two heat sinks,
   E) an electric circuit for providing power from said at least two thermoelectric modules to operate at least two fans and for providing additional electric power for operating an electronic device.

18. A portable combustion heat powered electronic device as in claim 17, wherein said at least two heat sinks is at least two fin units, and further comprising at least two fans each positioned to circulate air through each one of said at least two fin units.

19. A portable combustion heat powered electronic device, comprising:
   A) a hot block,
   B) a combustion heat source for heating said hot block,
   C) at least one thermoelectric module,
   D) at least one cold side heat sink,
   E) an electric circuit for providing power from said at least one thermoelectric module to operate an electronic device, and
   F) a casing,
   wherein said combustion heat source, said at least one thermoelectric module, and said electric circuit are contained inside said casing for protection and transportability.

20. A portable thermoelectric generator as in claim 19, wherein said cold side heat sink is at least one fin unit attached to said casing.

21. A portable thermoelectric generator as in claim 19, wherein said cold side heat sink is a heat pipe unit.

* * * * *